US011988882B2

(12) United States Patent
Ohlsson

(10) Patent No.: US 11,988,882 B2
(45) Date of Patent: May 21, 2024

(54) DEVICE FOR TRANSFERRING HEAT BETWEEN A FIRST MODULE AND A SECOND MODULE

(71) Applicant: Huawei Technologies Co., Ltd., Shenzhen (CN)

(72) Inventor: Fredrik Ohlsson, Kista (SE)

(73) Assignee: Huawei Technologies Co., Ltd., Shenzhen (CN)

( * ) Notice: Subject to any disclaimer, the term of this patent is extended or adjusted under 35 U.S.C. 154(b) by 317 days.

(21) Appl. No.: 17/575,337

(22) Filed: Jan. 13, 2022

(65) Prior Publication Data
US 2022/0137311 A1 May 5, 2022

Related U.S. Application Data

(63) Continuation of application No. PCT/EP2020/054708, filed on Feb. 24, 2020.

(51) Int. Cl.
*H05K 7/20* (2006.01)
*G02B 6/42* (2006.01)

(52) U.S. Cl.
CPC ....... *G02B 6/4269* (2013.01); *H05K 7/20418* (2013.01); *H05K 7/2049* (2013.01)

(58) Field of Classification Search
CPC .... H01R 13/6581; H01R 24/28; H01R 24/64; H01R 25/006; H01R 2107/00; G02B 6/4266
See application file for complete search history.

(56) References Cited

U.S. PATENT DOCUMENTS

| 5,751,062 A * | 5/1998 | Daikoku ............. H01L 23/4338 257/713 |
| 5,838,065 A * | 11/1998 | Hamburgen ........ H01L 23/3738 257/722 |
| 6,604,575 B1 * | 8/2003 | Degtiarenko ............. F28F 5/00 165/185 |
| 7,625,223 B1 * | 12/2009 | Fogg .................. H05K 7/20509 439/607.3 |
| 7,974,098 B2 * | 7/2011 | Oki ...................... G02B 6/4201 165/185 |
| 9,343,851 B2 * | 5/2016 | Bucher ................ H01R 12/722 |
| 9,620,890 B1 | 4/2017 | Vino, IV et al. |
| 9,912,107 B2 * | 3/2018 | Bucher ................ G02B 6/4269 |
| 9,924,615 B2 * | 3/2018 | Bucher ................ G02B 6/4277 |
| 2008/0239676 A1 | 10/2008 | Ross et al. |

(Continued)

FOREIGN PATENT DOCUMENTS

CN 107453173 A 12/2017
WO 2017119719 A1 7/2017

*Primary Examiner* — Zachary Pape
*Assistant Examiner* — Steven Ngo
(74) *Attorney, Agent, or Firm* — Slater Matsil, LLP

(57) ABSTRACT

The disclosure relates to a device for transferring heat between a second module, for example an optical transceiver module, and a first module, for example a heat sink. The device comprises a holder for holding the second module, a first unit configured to be thermally coupled to the first module, and a second unit which is urged against the second module placed in the holder by a biasing apparatus. The first and second units are thermally coupled to one another through a plurality of protrusions of the first or second unit and a plurality of complementary cavities of the other of the first and second unit.

20 Claims, 6 Drawing Sheets

(56) References Cited

U.S. PATENT DOCUMENTS

2013/0000865 A1     1/2013  Shi
2018/0306989 A1 *  10/2018  Khazen ................ G02B 6/4269
2020/0221607 A1 *   7/2020  Bucher ................ H01R 12/716
2020/0257067 A1 *   8/2020  Meunier .............. G02B 6/4284

* cited by examiner

DEVICE FOR TRANSFERRING HEAT BETWEEN A FIRST MODULE AND A SECOND MODULE

CROSS-REFERENCE TO RELATED APPLICATIONS

This application is a continuation of International Application No. PCT/EP2020/054708, filed on Feb. 24, 2020, the disclosure of which is hereby incorporated by reference in its entirety.

TECHNICAL FIELD

The disclosure relates to a device for transferring heat between a first module and a second module. The disclosure also relates to an arrangement for cooling a thermally conductive second module, the arrangement including the device. Further, the disclosure relates to a network access node for a wireless communication system, wherein the network access node comprises any one of a device of the above-mentioned sort and an arrangement of the above-mentioned sort. The network access node may comprise a base station.

BACKGROUND

In many areas, for example within the field of telecommunications, components may require thermal cooling. This may for example be the case for components in a network access node for a wireless communication system, such as for example a base station. Thermal cooling involves a transfer of heat from the module or component to be cooled, e.g. to the ambient or to another module or component, such as an electrical active cooling device or a passive heat sink. A passive heat sink does not require electric power to transfer heat. In general, a heat sink may be seen as a passive heat exchanger configured to transfer heat from a heat-producing component to another medium, such as air or any other fluid medium, for example a liquid. A heat sink can, for example, release the received heat partly or entirely to the ambient via cooling fins of a fin structure. Between the module or component to be cooled and an active cooling device or a heat sink, there may be structures and thermally insulating air gaps which impair the heat transfer to the active cooling device or heat sink.

SUMMARY

An object of embodiments of the disclosure is to provide a solution which mitigates or solves the drawbacks and problems of conventional solutions.

According to a first aspect of the disclosure, the above-mentioned and other objects are achieved with a device for transferring heat between a first module and a second module. The device comprises: a holder for holding the second module, a first unit configured to be thermally coupled to the first module, a second unit movable in a first direction in relation to the first unit and the holder, and a biasing apparatus for urging the second unit away from the first unit, thereby urging the second unit against the second module placed in the holder, wherein the first unit and the second unit are thermally coupled to one another, wherein one of the first and second units comprises a plurality of protrusions and the other one of the first and second units comprises a plurality of cavities, each cavity of the plurality of cavities being complementary to one of the plurality of protrusions, wherein each protrusion of the plurality of protrusions engages one of the plurality of cavities, wherein each protrusion of the plurality of protrusions has a contact surface and each cavity of the plurality of cavities has a contact surface, the contact surface of each protrusion of the plurality of protrusions facing the contact surface of one of the plurality of cavities.

An advantage of the device according to the first aspect is that the plurality of protrusions and the plurality of cavities of the first unit and the second unit, respectively, increase the surface area of the first unit and the second unit. Thereby, the thermal coupling between the first unit and the second unit can be improved such that an efficient heat transfer between the first module and the second module can be provided. When the second module is a heat-generating module, the thermal coupling between the first unit and second unit provides an efficient heat transfer from the second module to the first module and hence an efficient cooling of the second module. The biasing apparatus ensures a suitable contact pressure for good thermal transfer between the second module and the second unit. The biasing apparatus may comprise an elastic element or a resilient element (e.g. a spring) and may therefore be referred to herein also as a spring element or resilient element. An advantage of the device according to the first aspect is that the heat transfer between the second module and the first module is improved. Consequently, an improved heat dissipation is provided.

In an implementation form of a device according to the first aspect, each contact surface has a first extension which extends in the first direction. An advantage with this implementation form is that the contact surfaces of the plurality of protrusions and the contact surfaces of the plurality of cavities extend in the direction in which the second unit moves. Thus, a distance between the contact surfaces facing each other can be maintained when the second unit moves between relative to the first unit. Thereby, a good thermal coupling between the first unit and the second unit is ensured.

In an implementation form of a device according to the first aspect, each protrusion of the plurality of protrusions is shaped as a cylinder. An advantage with this implementation form is that the plurality of protrusions is easy and inexpensive to manufacture.

In an implementation form of a device according to the first aspect, the inner surface of each cavity of the plurality of cavities matches the protrusion shaped as a cylinder which engages the cavity. An advantage with this implementation form is that each cavity easily engages with its respective protrusion and that the heat transfer area between each cavity and its respective protrusion can be increased. Thereby, the thermal coupling between the first unit and the second unit can provide an efficient heat transfer between the first module and the second module.

In an implementation form of a device according to the first aspect, each cavity of the plurality of cavities is a recess. The recess may have a bottom section. An advantage with this implementation form is that the plurality of cavities is easy and inexpensive to manufacture. Alternatively, the cavity may be a through-hole.

In an implementation form of a device according to the first aspect, the plurality of protrusions comprises at least five protrusions and the plurality of cavities comprises at least five cavities. An advantage with this implementation form is that the increase of the surface area of the first unit and the second unit is such that the heat transfer between the first module and the second module can be increased.

In an implementation form of a device according to the first aspect, the first unit is configured to be fixed in relation to the first module. "Fixed in relation to the first module" in the context of this embodiment means that the first unit is stationary in relation to the first module, i.e. the first unit does not move relative to the first module. An advantage with this implementation form is that a good thermal coupling between the first unit and the first module can be provided.

In an implementation form of a device according to the first aspect, the first unit is configured to be connected the first module. The first unit may be configured to be connected to the first module by being configured to be attached to the first module or by being configured to be formed integrally with the first module, i.e. formed as a unit with the first module. An advantage with this implementation form is a flexible design of the first unit and the first module.

In an implementation form of a device according to the first aspect, there is a gap between at least a portion of the contact surface of each cavity of the plurality of cavities and at least a portion of the contact surface of the protrusion of the plurality of protrusions which engages the cavity. An advantage with this implementation form is that manufacturing variances with regard to the plurality of cavities and the engaging plurality of protrusions can be handled.

In an implementation form of a device according to the first aspect, each cavity of the plurality of cavities holds a thermally conductive grease. An advantage with this implementation form is that the thermal resistance between the first unit and the second unit can be further reduced. Thereby, the thermal coupling between the first unit and the second unit is improved and hence the heat transfer between the first module and the second module is improved.

In an implementation form of a device according to the first aspect, the biasing apparatus comprises any one from the group comprising: a spring and a gasket. An advantage with this implementation form is that the biasing apparatus can be implemented by using standard components which are reliable and inexpensive.

In an implementation form of a device according to the first aspect, the holder comprises a compartment configured to receive and hold the second module. The compartment may further be configured to receive and hold the second module detachably.

In an implementation form of a device according to the first aspect, the device comprises a housing, which houses the compartment, and a printed circuit board, to which the housing is attached, wherein the compartment has a first opening for receiving the second module, the second module being connectable to the printed circuit board, wherein the compartment has a second opening, and wherein the second unit comprises a projection/boss, the projection being configured to engage the second opening and abut against the second module placed in the compartment. The embodiments of the device according to the disclosure are especially advantageous for such an implementation. Conventionally, an interface comprising a metal housing is often used for connecting a signal cable to a printed circuit board via a second module, for example a transceiver module, held by a compartment in the housing. By the second opening and embodiments of the device according to the present disclosure, an improved heat transfer is provided between the second module and the second unit for reasons mentioned above.

In an implementation form of a device according to the first aspect, the second unit covers the second opening. A second opening in the compartment could increase the risk of electromagnetic interference, EMI, leakage from the second module, for example the transceiver module, and from a connector electrically connecting the transceiver module to the printed circuit board. The electromagnetic interference leakage could for example influence an antenna nearby. Further, a second opening in the compartment could increase the risk of interference caused by signals from an antenna nearby or from other electrical components. However, when the second unit covers the second opening, electromagnetic interference shielding is provided. Thus, an improved heat transfer can be provided between the second module and the first module without an increased risk of electromagnetic interference leakage.

In an implementation form of a device according to the first aspect, the holder is configured to hold a second module which is a transceiver module to which a signal cable is connectable. The transceiver module is mechanically connectable to the signal cable. When the signal cable is connected to the transceiver module, a signal connection is provided between the transceiver module and signal cable, i.e. a connection through which signal transmission is possible. The transceiver module may in turn be electrically connectable or connected to a printed circuit board, PCB. The transceiver module may be an optical transceiver module and the signal cable may be an optical signal cable, for example an optical fibre cable. When in use, an optical transceiver module produces a substantial amount of heat which should be dissipated or transferred away from the optical transceiver module, and also away from a printed circuit board located close to the transceiver module. The heat is produced when the optical transceiver module converts optical signals to electrical signals. The electrical signals are then transmitted to the printed circuit board. Thus, for applications where the second module is a transceiver module, for example an optical transceiver module, the embodiments of the device according to the disclosure are especially advantageous.

In an implementation form of a device according to the first aspect, the holder is configured to receive and hold a second module which is any module from the group comprising: a small form-factor pluggable, SFP, module and a quad small form-factor pluggable, QSFP, module. An advantage with this implementation form is that a flexible mechanical connection for the second module is provided involving the known concepts SFP and QSFP.

According to a second aspect of the disclosure, the above mentioned and other objects are achieved with an arrangement for cooling a second module, the arrangement comprises the device according to any one of the appended claims 1 to 16 and the first module which comprises a heat sink.

An advantage of the arrangement according to the second aspect is that an improved heat transfer between a second module placed in the holder of the device and the first module in the form of a heat sink is provided. Further advantages correspond to the advantages of the device and its embodiments mentioned above or below.

In an implementation form of an arrangement according to the second aspect, the arrangement comprises the second module.

According to a third aspect of the disclosure, the above mentioned and other objects are achieved with a network access node, which may comprise a base station, for a wireless communication system, wherein the network access node comprises a device or an arrangement according to any of the above- or below-mentioned embodiments. Advantages of the network access node correspond to the advantages of the device and the arrangement and their embodiments mentioned above or below. The network access node may comprise a base station.

Further applications and advantages of the embodiments of the disclosure will be apparent from the following detailed description.

BRIEF DESCRIPTION OF THE DRAWINGS

The appended drawings are intended to clarify and explain different embodiments of the disclosure, in which.

DETAILED DESCRIPTION OF ILLUSTRATIVE EMBODIMENTS

In order to cool a module, for example an electrical component, an electrical active cooling device or a passive heat sink may be used. The use of an electrical active cooling device to cool the module has the disadvantage that the electrical active cooling device consumes power to lower the temperature. This leads to high costs and to the generation of heat load in other parts or components close to the module.

Another disadvantage with conventional cooling is that air gaps may be present between the module to be cooled and the electrical active cooling device or the passive heat sink. Air gaps introduce high thermal resistance and make it more difficult to cool the module. In order to avoid air gaps a thermally conductive filling material, which provide and facilitate the heat transfer, may be placed between the module to be cooled and the active cooling device or the passive heat sink. Conventional thermal interface materials are resilient to a certain extent to be able to expand and fill the air gaps but may lose their resilient character completely or to some degree after some time in a compressed state. Thus, the thermal interface material may for example not properly expand and fill the air gaps when the module is removed and replaced or reintroduced after inspection. This leads to thermally insulating air gaps which reduce the heat transfer between the module and the electrical active cooling device or the passive heat sink. There may hence be a temperature increase in the module, which results in an increased risk of overheating and a shortened lifetime of the module.

According to embodiments of the disclosure, a device for transferring or conducting heat between a first module and a second module is disclosed. The device improves the heat transfer between the first module and the second module and can address manufacturing variances with regard to the first module and the second module. The device further maintains its flexibility over time.

Figure 1A:
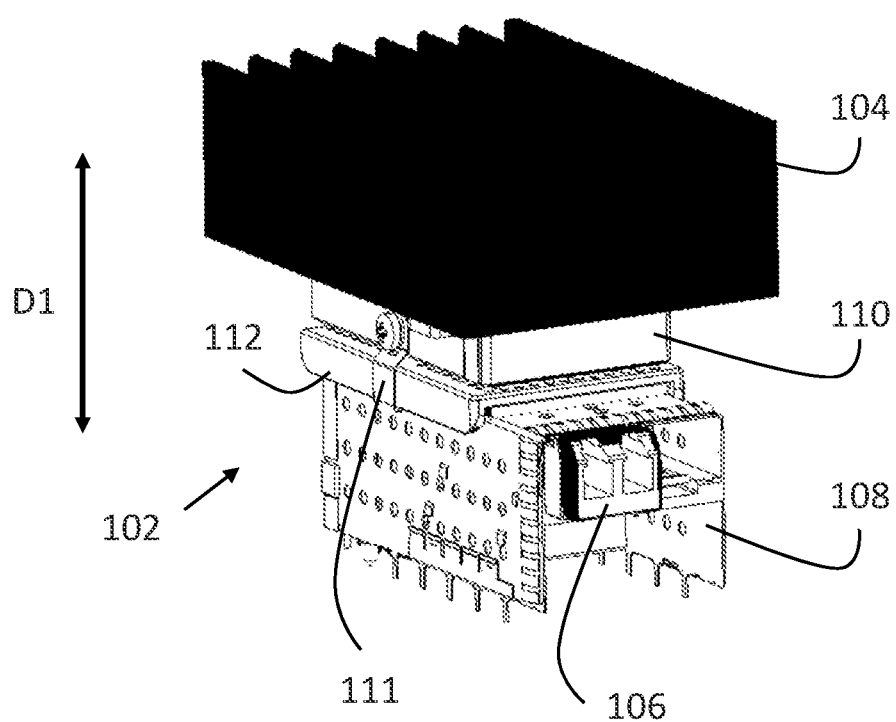
FIGS. 1a-c are schematic views of a device according to an embodiment of the disclosure.
Figure 1B:
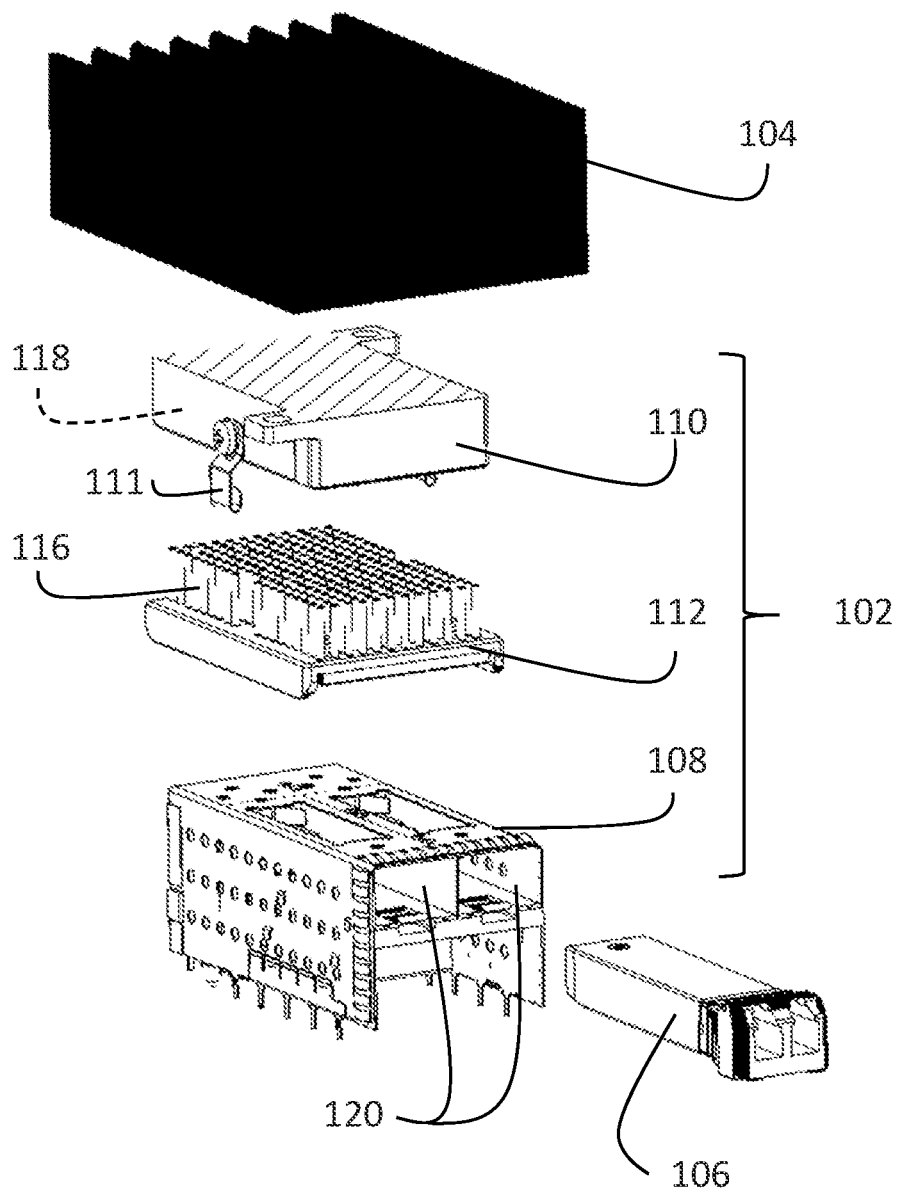
Figure 1C:
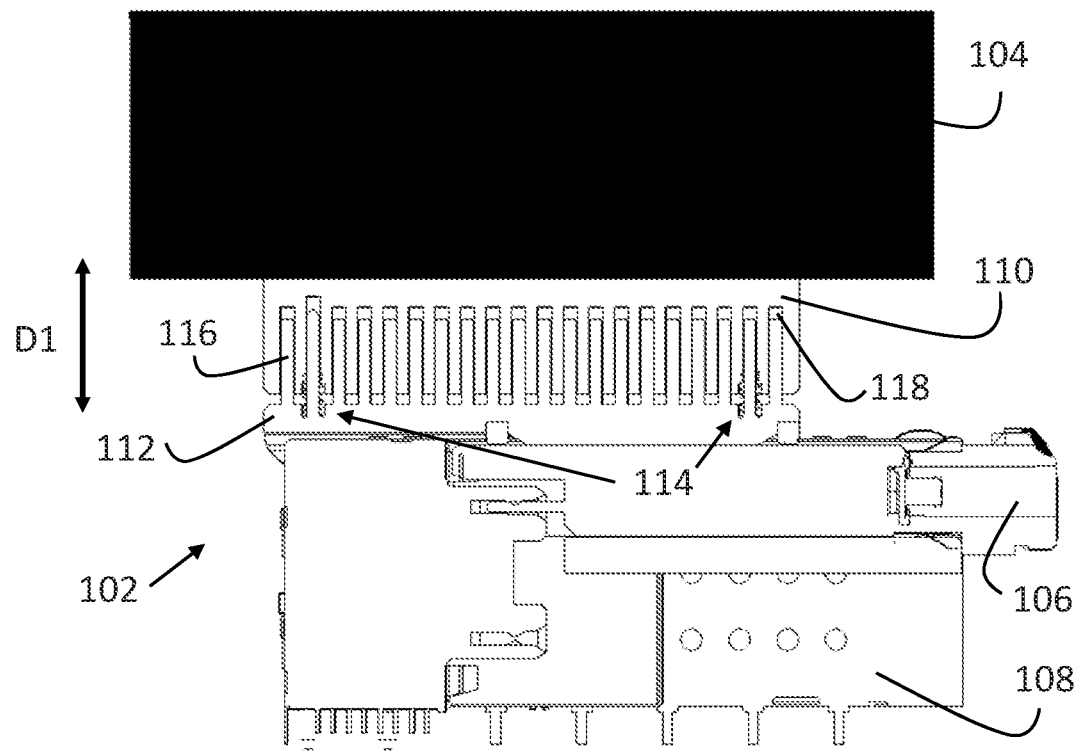

FIGS. 1a-c schematically illustrates a device 102 for transferring or conducting heat between a first module 104 and a second module 106 according to an embodiment of the disclosure. In the embodiment shown in FIGS. 1a-c, the second module 106 is a heat-generating module and the device 102 hence transfers heat from the second module 106 to the first module 104. The device 102 comprises a holder 108 for holding the second module 106. Further, the device 102 includes a first unit 110 configured to be thermally coupled to the first module 104. By thermal coupling is meant that there is a heat transfer between the first unit 110 and the first module 104, or in other words, that there is a heat-conducting communication between the first unit 110 and the first module 104. The first unit 110 may be thermally coupled to the first module 104, for example through direct physical abutment or via additional thermally conductive material.

In embodiments of the device 102, the first unit 110 is configured to be fixed, i.e. stationary, in relation to the first module 104 such that the first unit 110 does not move relative to the first module 104. The first unit 110 may further be configured to be connected to the first module 104. The first unit 110 may be connected/attached to the first module 104 by using for example a mechanical fastening means or an adhesive. Alternatively, the first unit 110 may be integral with the first module 104, i.e. formed as a unit with the first module 104. When the first unit 110 is attached to the first module 104, a thermal interface material, TIM, may be arranged between the first unit 110 and the first module 104 to further reduce thermal resistance between them.

The device 102 further comprises a second unit 112. The first unit 110 and the second unit 112 are thermally coupled to one another, i.e. there is a heat transfer between the first unit 110 and the second unit 112. The second unit 112 is movable in a first direction D1 in relation to the first unit 110 and the holder 108, and also in relation to the first module 104. With reference to FIG. 1a, the second unit 112 may be arranged between the first unit 110 and the holder 108 such that the second unit 112 moves in the first direction D1 between the first unit 110 and the holder 108. Thus, the second unit 112 may move in the first direction D1 both towards the first unit 110 and towards the holder 108.

In the embodiment shown in FIGS. 1a-c, a fastening means in is configured to connect/attach the first unit 110 and the second unit 112 to each other. The connection provided by the fastening means in is such that it allows the second unit 112 to move in the first direction D1 in relation to the first unit 110 and the holder 108. However, in alternative embodiments, the first unit 110 and the second unit 112 may instead be thermally coupled without being connected/attached with a fastening means.

With reference to FIG. 1c, the device 102 further comprises a biasing apparatus 114 for urging the second unit 112 away from the first unit 110, thereby urging the second unit 112 against the second module 106 placed in the holder 108. When the biasing apparatus 114 urges the second unit 112 away from the first unit 110, the second unit 112 is moved in the first direction D1 towards the second module 106 placed in the holder 108 such that the second unit 112 abuts the second module 106. The second unit 112 is hence thermally coupled to the second module 106, when the second module 106 is held in the holder 108. The second unit 112 may be thermally coupled to the second module 106 through direct physical abutment or via additional thermally conductive material.

One of the first and second units 110, 112 comprises a plurality of protrusions 116 and the other one of the first and second units 110, 112 comprises a plurality of cavities 118. In the embodiment shown in FIGS. 1a-c, the first unit 110 comprises the plurality of cavities 118, and the second unit 112 comprises the plurality of protrusions 116. However, in alternative embodiments, the second unit 112 may include the plurality of cavities 118, and the first unit 110 may include the plurality of protrusions 116. Furthermore, each of the first unit 110 and the second unit 112 may, in alternative embodiments, comprise both a plurality of protrusions 116 and a plurality of cavities 118.

Each cavity 118 of the plurality of cavities 118 is complementary to one of the plurality of protrusions 116 and each protrusion 116 of the plurality of protrusions 116 engages one of the plurality of cavities 118. This allows each protrusion 116 to fit into a complementary cavity 118, as illustrated in FIG. 1c. Furthermore, each protrusion 116 of the plurality of protrusions 116 has a contact surface, and each cavity 118 of the plurality of cavities 118 has a contact surface. The contact surface of each protrusion 116 of the plurality of protrusions 116 faces the contact surface of one the plurality of cavities 118. Each contact surface has a first extension which extends in the first direction D1. Thus, when the second unit 112 moves in the first direction D1 between the first unit 110 and the holder 108, the plurality of protrusions 116 may move within their respective cavity 118 with the contact surface of each protrusion 116 still facing the contact surface of the engaged cavity 118.

The plurality of protrusions 116 and the plurality of cavities 118 increases the surface area of the first unit 110 and the second unit 112, respectively, making it possible to increase a thermal interface area between the first unit 110 and the second unit 112. The thermal interface area comprises the area where the first unit 110 and the second unit 112 essentially abut or are in contact with each other, i.e. comprises the contact surfaces of the plurality of protrusions 116 facing the contact surfaces of the plurality of cavities 118. Hence, the size of the thermal interface area depends on the circumference of the protrusions 116, the length of the contact surfaces and the number of engaging protrusion 116 and cavity 118 pairs. The thermal interface area can thus be adjusted by adapting the shape and number of protrusions 116 and cavities 118. Since the heat transfer between the first unit 110 and the second unit 112 depends on the thermal interface area, the shape and number of protrusions 116 and cavities 118 affect the heat transfer capability of the device 102. Thus, by adjusting the shape and number of protrusions 116 and cavities 118, the heat transfer capability of the device 102 can be adapted to different applications and heat loads to be transferred.

In embodiments, the plurality of protrusions 116 comprises at least five protrusions 116, and the plurality of cavities 118 comprises at least five cavities 118. The plurality of protrusions 116 and the plurality of cavities 118 may however in some embodiments comprise any one of at least ten, at least twenty, at least fifty, at least one hundred, at least two hundred or more protrusions 116 and cavities 118, respectively.

Figure 2:
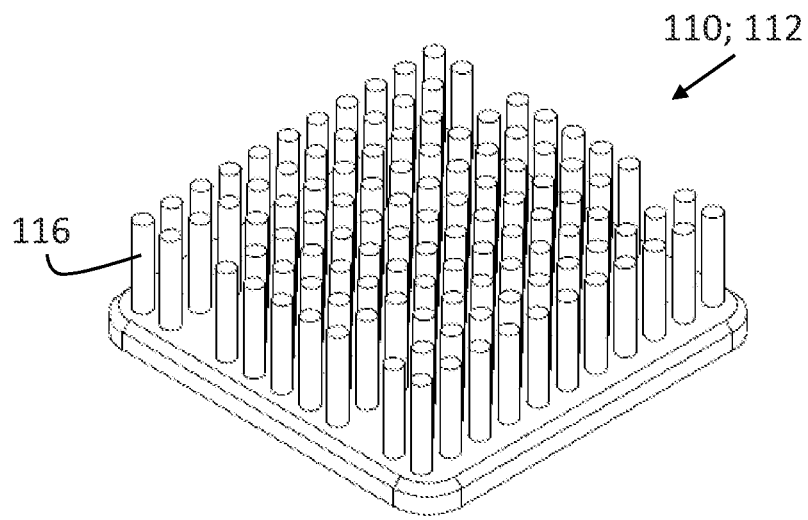
FIG. 2 is a schematic perspective view of a first or second unit according to an embodiment of the disclosure.

According to embodiments of the disclosure, each protrusion 116 of the plurality of protrusions 116 may be shaped as a cylinder. With reference to FIG. 2, each protrusion 116 may for example be a pin/finger with a right circular cylinder shape. In other words, each protrusion 116 may have the same circular cross-section over the height of the protrusion 116 and extend essentially perpendicular from the first or second unit 110, 112. Each protrusion 116 may further be solid or hollow. The plurality of protrusions 116 may be arranged in rows, where the rows may comprise the same or a different number of protrusions 116, or in other formations.

The shape of each cavity 118 matches the shape of the protrusion 116 with which the cavity 118 engages such that the protrusion 116 can fit into the cavity 118. Each cavity 118 of the plurality of cavities 118 may be a recess arranged to receive the engaging protrusion 116. The recess may have a bottom section. Alternatively, each cavity 118 of the plurality of cavities 118 may be a through-hole. In embodiments where each protrusion 116 of the plurality of protrusions 116 is shaped as a cylinder, the inner surface of each cavity 118 of the plurality of cavities 118 matches the protrusion 116 shaped as a cylinder which engages the cavity 118. The plurality of cavities 118 may hence be recesses/holes with an inner shape of a cylinder. For example, each cavity 118 may have a right circular cylinder shape dimensioned to engage with a protrusion 116 with a right circular cylinder shape, such as the one shown in FIG. 2. The diameter of the cavity 118 may be slightly larger than the diameter of the protrusion 116 so that the protrusion 116 can move within the engaged cavity 118. For example, this allows the protrusion 116 to move in the first direction D1 and take different positions in the engaged cavity 118.

The increased surface area of the first unit 110 and the second unit 112 can also be achieved with protrusions 116 and cavities 118 of other shapes than the above described. The protrusions 116 and cavities 118 may for example have a cylinder shape with a triangular, rectangular, or polygonal cross-section. Alternatively, the protrusions 116 and cavities 118 may have a conical shape with a circular, triangular, rectangular or polygonal base. Furthermore, each of the protrusions 116 may have an extended flat shape, for example be a longitudinal fin extending over at least a part of the length of the first or second unit 110, 112. Each cavity 118 may in this case comprise the recess between two longitudinal fins extending over at least a part of the length of the other of the first or second unit 110, 112. The fins may be formed with different geometrical shapes, for example be rectangular or have a rounded form.

The plurality of protrusions 116 and the plurality of cavities 118 of the first and second units 110, 112 may be manufactured by using any one of: cold forging, casting, machining, drilling, 3D-printing, extruding, and press fitting. The plurality of protrusions 116 and the plurality of cavities 118 may for example be made of aluminum, copper, zinc, graphite or other conductive materials.

The dimension of the plurality of protrusions 116 and the plurality of cavities 118 may vary depending on for example the application of the device 102 and the heat load generated by the second module 106. The height of the protrusions 116 and the depth of the cavities 118 may be selected such that at least a part of each protrusion 116 stays inside the cavity 118 with which it engages, when the second unit 112 moves in the first direction D1 towards the holder 108. In this way, the plurality of protrusions 116 and the plurality of cavities 118 can ensure the thermal coupling between the first unit 110 and the second unit 112. In a non-limiting example, the diameter of each protrusion 116 may be approximately 0.5-1 mm and the height of each protrusion 116 may be approximately 5-10 mm. The diameter and depth of the cavities 118 may match the dimensions of the protrusions 116 but may be slightly larger.

The plurality of protrusions 116 and the complementary plurality of cavities 118 ensures a large contact surface and thereby a good thermal coupling between the first unit 110 and the second units 112. To further increase the heat transfer between the first unit 110 and the second units 112, each cavity 118 of the plurality of cavities 118 may hold a thermally conductive medium, for example a grease, an oil, or a liquid. The thermally conductive medium further reduces the thermal resistance between the protrusions 116 and the cavities 118, by filling a space between each protrusion 116 and its engaged cavity 118 arising for example from manufacturing variances allowing the protrusions 116 to move within in the cavities 118.

In embodiments, there is a gap between at least a portion of the contact surface of each cavity 118 of the plurality of cavities 118 and at least a portion of the contact surface of the protrusion 116 of the plurality of protrusions 116 which engages the cavity 118. In such embodiments, the thermally conductive medium grease may be arranged to fill the gaps. The gap ensures a smooth engagement between the plurality of cavity 118 and the plurality of protrusions 116 such that each protrusion 116 can move easily within its engaging cavity 118. Thereby, manufacturing variances with regard to the plurality of cavities 118 and the engaging plurality of protrusions 116 are addressed.

As illustrated in FIG. 1c, the biasing apparatus 114, which also may be called a resilient element or a spring element, may be located between the first unit 110 and the second unit 112. The biasing apparatus 114 is configured to urge (or force or bias) the second unit 112 away from the first unit 110. The biasing apparatus 114 may further be configured to urge (or force or bias) the first unit 110 away from the second unit 112. In other words, the biasing apparatus 114 is configured to push (or impel) the second unit 112 in relation to the first unit 110 in a direction away from the first unit 110 and to push (or impel) the first unit 110 in relation to the second unit 112 in direction away from the second unit 112. With reference to FIG. 1c, the biasing apparatus 114 hence urges the second unit 112 against the second module 106 placed in the holder 108. Thus, urging the second unit 112 towards physical contact with the second module 106 such that a good thermal coupling is achieved between the second unit 112 and the second module 106. Furthermore, the biasing apparatus 114 may be arranged such that the entire area of a first surface of the second unit 112 is urged against the second module 106. In this way an even pressure over the entire contact surface between the second unit 112 and the second module 106 can be achieved.

The biasing apparatus 114 may comprise any one from the group comprising: a spring and a gasket. The biasing apparatus 114 may for example be at least one of a coil spring, a spring plate, a helical spring and an O-ring. The biasing apparatus 114 may be arranged either between the first unit 110 and the second unit 112 or on the outside of the first unit 110 and/or the second unit 112. In embodiments where the biasing apparatus 114 is located in between the first unit 110 and the second unit 112, the biasing apparatus 114 may be arranged around one or more of the protrusions 116 of the first or second unit 110, 112 and/or in one or more of the cavities 118 of the first or second unit 110, 112.

In the embodiment shown in FIG. 1 c, the biasing apparatus 114 comprises two springs, each spring being arranged around one protrusion 116 at opposite sides of the second unit 112. Thereby, the biasing apparatus 114 urges the entire surface of the second unit 112 facing the second module 106 against the second module 106.

Figure 3:
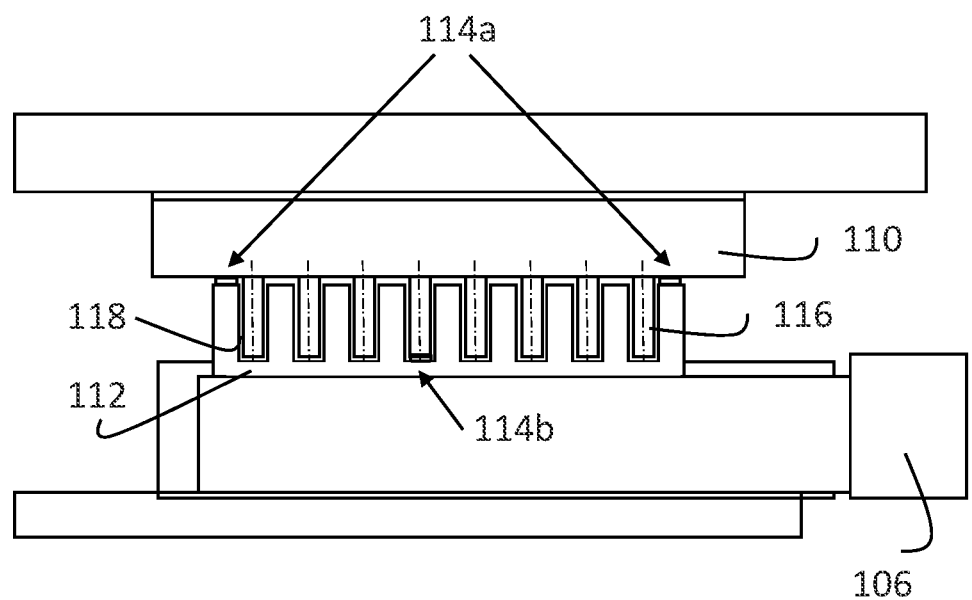
FIG. 3 is a schematic cross-section view of a device according to an embodiment of the disclosure.

FIG. 3 shows two alternative implementations of the biasing apparatus 114. In a first alternative, the biasing apparatus 114 comprises a gasket 114a arranged between the first unit 110 and the second unit 112, for example around a circumference of the second unit 112. In a second alternative, the biasing apparatus 114 comprises a gasket 114b arranged in one of the cavities 118 positioned in the middle of the second unit 112.

According to embodiments of the disclosure, the holder 108 may comprise a compartment 120 configured to receive and hold the second module 106. In the embodiment shown in FIGS. 1a-c, the holder 108 comprises two compartments 120, where each compartment 120 can receive and hold one second module 106. However, the holder 108 may have fewer or more compartments 120. In FIG. 1a, the compartment 120 to the right is illustrated without a second module 106, and the compartment 120 to the left is illustrated with a second module 106 received and held therein. The compartment 120 may be configured to detachably secure the second module 106 such that the second module 106 can be replaced or removed and re-inserted into the compartment 120.

Figure 4:
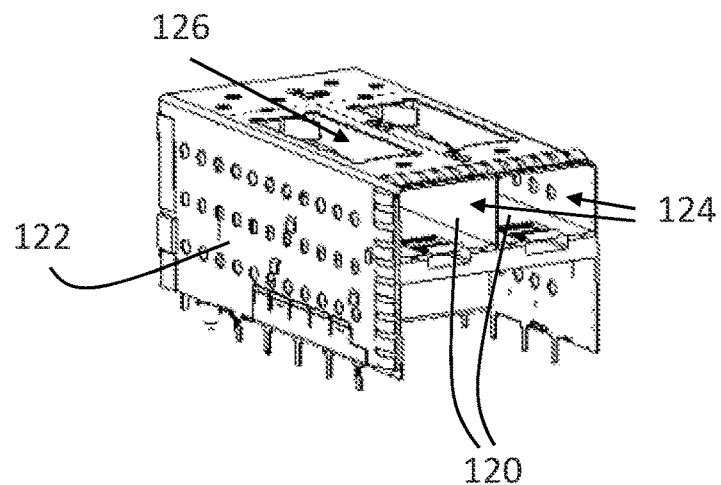
FIG. 4 is a schematic perspective view of a housing according to an embodiment of the disclosure.

In some embodiments, the holder 108 may correspond to a housing 122 as schematically illustrated in FIG. 4. Thus, the device 102 may in some embodiments comprise a housing 122. The housing 122 houses the compartment 120 and is configured to be attached to a printed circuit board (not shown in the figures). The housing 122 may also be referred to as a case or casing and may for example be a metal casing. The housing 122 illustrated in FIG. 4 comprises two compartments 120, each compartment 120 having a first opening 124 for receiving the second module 106, the second module 106 being connectable to the printed circuit board. Each compartment 120 further has a second opening 126 which exposes at least a part of the second module 106 when held in the compartment 120.

Figure 5:
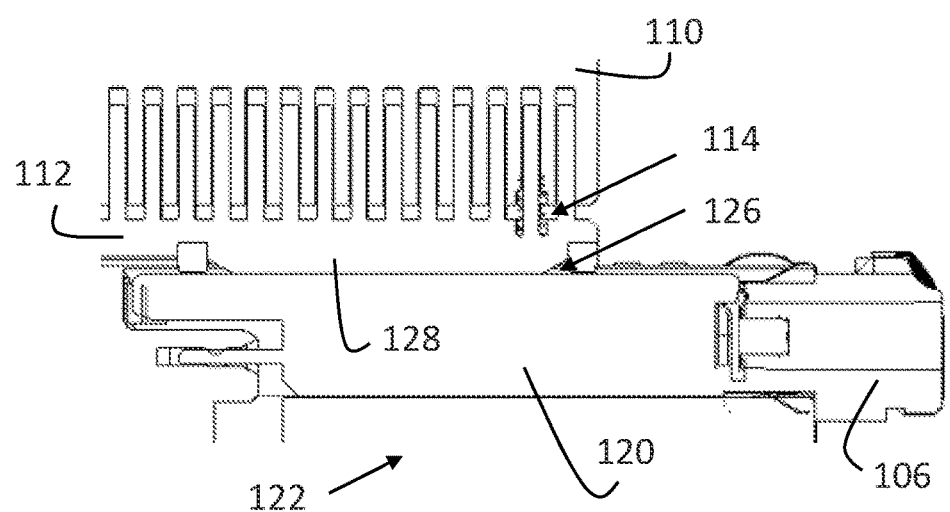
FIG. 5 is schematic cross-section view of a part of a device according to an embodiment of the disclosure.

With reference to FIG. 5, the second opening 126 of the compartment 120 may face the second unit 112 and the second unit 112 may comprise a projection/boss 128 configured to engage the second opening 126 and abut against the second module 106 placed in the compartment 120. The second unit 112 is thus brought into physical and thermal contact with the second module 106 held in the compartment 120. The physical and thermal contact between the second unit 112 and the second module 106 may in some embodiments be provided via additional thermally conductive material. The projection 128 of the second unit 112 together with the biasing apparatus 114 urging the second unit 112 away from the first unit 110 in the first direction ensure a good thermal connection between the second unit 112 and the second module 106 held in the compartment 120 of the housing 122. To allow the second module 106 to easily be inserted and removed from the compartment 120, the projection 128 of the second unit 112 may have tampered edges, as indicated in FIG. 5. This provides sliding surfaces between the projection 128 and the second module 106 and hence prevents the second module 106 to be caught by an edge of the projection 128 during insertion and removal of the second module 106.

The second unit 112 may cover the second opening 126. When the second unit 112 covers the second opening 126, shielding against electromagnetic interference can be provided. This reduces the risk of electromagnetic interference, EMI, leakage to and/or from the second module 106 through the second opening 126. Thereby, the risk that the second module 106 causes interference to an antenna or other electrical components nearby is reduced, as well as the risk of interference in the second module 106 caused by signals from an antenna or from other electrical components nearby. Thus, an improved heat transfer can be provided between the second module 106 and the first module 104 without an increased risk of electromagnetic interference leakage.

According to embodiments of the disclosure, the holder 108 may be configured to hold a second module 106 which is a transceiver module to which a signal cable is connectable. The second module 106 may for example be an optical transceiver module to which an optical signal cable, for example an optical fibre cable, is connected. However, the transceiver module may also be configured to be connectable to an electrical signal cable. The device 102 according to the embodiments of the present disclosure may be especially advantageous for applications where the second module 106 is an optical transceiver module, since when converting optical signals from the optical signal cable to electrical signals for transmission to the printed circuit board, the optical transceiver module generates a substantial amount of heat, which should be dissipated or transferred away from the optical transceiver module, to protect the optical transceiver module from heat, since the optical transceiver module is sensitive to high temperatures. The reliability and lifetime of a transceiver module is related to the module temperature. Typical allowed maximum temperatures for the optical transceiver module is 75° C. or 85° C. The temperature of the optical transceiver module can be reduced by 2-5° C., but also by more, for example by 10-20° C., if a thermally insulating air gap or air pocket is avoided by the use of the device 102.

The holder 108 may further be configured to receive and hold a second module 106 which is any module from the group comprising: a small form-factor pluggable (SFP) module and a quad small form-factor pluggable (QSFP) module. The holder 108 may hence be an SFP or QSFP housing configured to receive the SFP module or the QSFP module, respectively. The signal cable, which may be an optical fibre cable, may be connectable to the SFP or QSFP module. SFP and QSFP per se are known to the person skilled in the art and are thus not further described in this disclosure.

Figure 6:
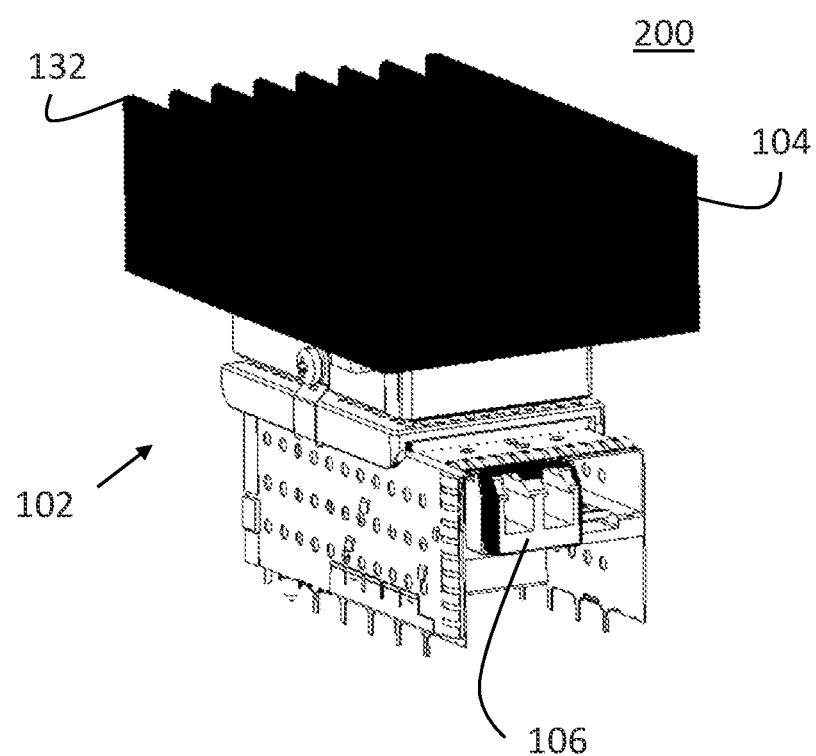
FIG. 6 is a schematic perspective view of an arrangement according to an embodiment of the disclosure.

The embodiments of the present disclosure also include an arrangement 200 for cooling a second module 106. FIG. 6 shows the arrangement 200 according to an embodiment of the disclosure. The arrangement 200 comprises a device 102 according to any one of the embodiments disclosed above, and a first module 104 which comprises a heat sink. With reference to FIG. 6, the first module 104 may be in the form of a heat sink having cooling fins 132 for heat dissipation. The arrangement 200 may further comprise the second module 106 held in the device 102. The arrangement 200 improves the heat transfer from the second module 106 to the first module 104 by means of embodiments of the device 102. Consequently, the arrangement 200 can provide an improved heat dissipation.

The embodiments of the present disclosure also include a network access node for a wireless communication system. The network access node comprises any one of the device 102 and the arrangement 200 according to the embodiments disclosed above. The network access node may comprise a base station, for example a base radio station. The network access node may include one or more antennas. The base station may have a housing which houses the antenna. Alternatively, the antenna is mounted outside the housing of the base station, for example with a distance to the housing of the base station. The antenna may in embodiments be connectable to the printed circuit board comprised in the device 102 via a suitable cable. By means of embodiments of the device 102 and/or embodiments of the arrangement 200 an improved heat dissipation can be provided in the network access node.

Finally, it should be understood that the disclosure is not limited to the embodiments described above, but also relates to and incorporates all embodiments within the scope of the appended independent claims.

What is claimed is:

1. A device for transferring heat between a first module and a second module, the device comprising:
a holder for holding the second module;
a first unit configured to be thermally coupled to the first module;
a second unit movable in a first direction in relation to the first unit and the holder, the first unit and the second unit being thermally coupled to each other; and
a biasing apparatus for urging the second unit away from the first unit, and urging the second unit against the second module held in the holder; and
wherein one of the first unit and the second unit comprises a plurality of protrusions and the other one of the first unit and the second unit comprises a plurality of cavities, each cavity of the plurality of cavities being complementary to one of the plurality of protrusions;
wherein each protrusion of the plurality of protrusions engages one of the plurality of cavities; and
wherein each protrusion of the plurality of protrusions has a contact surface, and each cavity of the plurality of cavities has a contact surface, the contact surface of each protrusion of the plurality of protrusions facing the contact surface of one of the plurality of cavities.

2. The device according to claim 1, wherein each contact surface of the plurality of protrusions or the plurality of cavities has a first extension which extends in the first direction.

3. The device according to claim 1, wherein each protrusion of the plurality of protrusions is in a cylinder shape.

4. The device according to claim 3, wherein an inner surface of each cavity of the plurality of cavities matches a protrusion that engages a corresponding cavity.

5. The device according to claim 1, wherein each cavity of the plurality of cavities is a recess.

6. The device according to claim 1, wherein the plurality of protrusions comprises at least five protrusions and the plurality of cavities comprises at least five cavities.

7. The device according to claim 1, wherein the first unit is configured to be fixed in relation to the first module.

8. The device according to claim 7, wherein the first unit is configured to be connected to the first module.

9. The device according to claim 1, wherein there is a gap between at least a portion of the contact surface of each cavity of the plurality of cavities and at least a portion of the contact surface of a protrusion of the plurality of protrusions, the protrusion engaging a corresponding cavity.

10. The device according to claim 1, wherein each cavity of the plurality of cavities holds a thermally conductive grease.

11. The device according to claim 1, wherein the biasing apparatus comprises one of a spring or a gasket.

12. The device according to claim 1, wherein the holder comprises a compartment configured to receive and hold the second module.

13. The device according to claim 12, wherein the device comprises a housing that houses the compartment, and a printed circuit board, to which the housing is attached, wherein the compartment has a first opening for receiving the second module, the second module being connectable to the printed circuit board, wherein the compartment has a second opening, and wherein the second unit comprises a projection, the projection being configured to engage the second opening and abut against the second module held in the compartment.

14. The device according to claim 13, wherein the second unit covers the second opening.

15. The device according to claim 1, wherein the second module is a transceiver module to which a signal cable is connectable.

16. The device according to claim 1, wherein the second module is a small form-factor pluggable (SFP) module, or a quad small form-factor pluggable (QSFP) module.

17. An arrangement for cooling a second module, the arrangement comprising a device and a first module, and the first module comprising a heat sink, wherein the device comprises:
- a holder for holding the second module;
- a first unit configured to be thermally coupled to the first module;
- a second unit movable in a first direction in relation to the first unit and the holder, the first unit and the second unit being thermally coupled to each other; and
- a biasing apparatus for urging the second unit away from the first unit, and for urging the second unit against the second module held in the holder; and
- wherein one of the first unit and the second unit comprises a plurality of protrusions and the other one of the first unit and the second unit comprises a plurality of cavities, each cavity of the plurality of cavities being complementary to one of the plurality of protrusions;
- wherein each protrusion of the plurality of protrusions engages one of the plurality of cavities; and
- wherein each protrusion of the plurality of protrusions has a contact surface, and each cavity of the plurality of cavities has a contact surface, the contact surface of each protrusion of the plurality of protrusions facing the contact surface of one of the plurality of cavities.

18. The arrangement according to claim 17, wherein the arrangement comprises the second module.

19. A network access node for a wireless communication system, wherein the network access node comprises an arrangement for cooling a second module, the arrangement comprises a device and a first module, and the first module comprises a heat sink, and wherein the device comprises:
- a holder for holding the second module;
- a first unit configured to be thermally coupled to the first module;
- a second unit movable in a first direction in relation to the first unit and the holder, the first unit and the second unit being thermally coupled to each other; and
- a biasing apparatus for urging the second unit away from the first unit, and for urging the second unit against the second module held in the holder; and
- wherein one of the first unit and the second unit comprises a plurality of protrusions and the other one of the first unit and the second unit comprises a plurality of cavities, each cavity of the plurality of cavities being complementary to one of the plurality of protrusions;
- wherein each protrusion of the plurality of protrusions engages one of the plurality of cavities; and
- wherein each protrusion of the plurality of protrusions has a contact surface, and each cavity of the plurality of cavities has a contact surface, the contact surface of each protrusion of the plurality of protrusions facing the contact surface of one of the plurality of cavities.

20. The network access node according to claim 19, wherein the arrangement comprises the second module.

\* \* \* \* \*